United States Patent [19]

Chang

[11] Patent Number: 5,500,605
[45] Date of Patent: Mar. 19, 1996

[54] ELECTRICAL TEST APPARATUS AND METHOD

[75] Inventor: David D. C. Chang, Princeton, N.J.

[73] Assignee: AT&T Corp., Murray Hill, N.J.

[21] Appl. No.: 121,850

[22] Filed: Sep. 17, 1993

[51] Int. Cl.$^6$ .................................................. G01R 1/073
[52] U.S. Cl. ........................... 324/758; 324/755; 324/761
[58] Field of Search .................................... 324/761, 754, 324/758, 755

[56] References Cited

U.S. PATENT DOCUMENTS

| | | | |
|---|---|---|---|
| 4,209,745 | 6/1980 | Hines | 324/761 |
| 4,322,682 | 3/1982 | Schadwill | 324/761 |
| 4,496,903 | 1/1985 | Paulinski | 324/761 |
| 4,573,009 | 2/1986 | Fowler et al. | 324/761 |
| 4,667,155 | 5/1987 | Coiner et al. | 324/761 |
| 4,771,234 | 9/1988 | Cook et al. | 324/761 |
| 4,935,695 | 6/1990 | Hayes et al. | 324/761 |
| 4,977,370 | 12/1990 | Andrews | 324/761 |
| 5,015,946 | 5/1991 | Janko | 324/761 |
| 5,206,585 | 4/1993 | Chang et al. | 324/754 |

OTHER PUBLICATIONS

"BGAs Face Production Testing," by D. Hattas, *Advanced Packaging*, Summer 1993, pp. 44–46.
"Cost-Effective Interconnections for High I/O MCM–C–to–Card Assemblies," by T. Caulfield et al., *Surface Mount Technology*, Jul. 1993, pp. 18–20.

*Primary Examiner*—Ernest F. Karlsen
*Attorney, Agent, or Firm*—Roderick B. Anderson; Kenneth M. Brown

[57] ABSTRACT

The invention is a method for testing an electronic device (10) of the type having on one side thereof an array of conductive projections, such as solder balls (15), arranged in a first configuration. An array of spring-loaded probes (25) is arranged in the first configuration. An insulative template (18) is formed comprising an array of apertures (19) arranged in the first configuration which is aligned with the spring-loaded conductive probes. The electronic device (10) is then forced against the template (18) such that each solder ball (15) projects into the aperture to contact a spring-loaded conductive probe (25). Electrical current is passed through at least part of the electronic device, at least some of the solder balls, and at least some of the conductive probes as is required for electrical testing of the electronic device.

9 Claims, 2 Drawing Sheets

ELECTRICAL TEST APPARATUS AND METHOD

TECHNICAL FIELD

This invention relates to electrical test techniques and, more particularly, to techniques for testing complex electronic devices having an array of solder elements on one surface thereof.

BACKGROUND OF THE INVENTION

Among many modern electronic device module designs is a device known as the ball grid array (BGA), which comprises an insulative substrate having one or more integrated circuit chips and other devices on an upper surface, and a matrix array of solder ball terminals on a lower surface. Because the solder ball terminals are located over the entire lower surface of the module, a greater circuit density can be accommodated than is true of conventional modules in which the terminations are all included around the periphery of the module. After BGA modules have been constructed, they of course must be tested, which requires a temporary connection to all or most of the solder balls contained on the lower surface.

Accordingly, there is a long-felt need in the industry for testing methods that would permit easy temporary connection to all of the terminals of a ball grid array, and which would permit the prompt and convenient testing of successive electronic devices having ball grid arrays.

SUMMARY OF THE INVENTION

The invention is a method for testing an electronic device of the type having on one side thereof an array of conductive projections, such as solder balls, arranged in a first configuration. An array of spring-loaded probes is arranged in the first configuration. An insulative template is formed comprising an array of apertures arranged in the first configuration which is aligned with the spring-loaded conductive probes. The electronic device is then forced against the template such that each solder ball projects into the aperture to contact a spring-loaded conductive probe. Electrical current is passed through at least part of the electronic device, at least some of the solder balls, and at least some of the conductive probes as is required for electrical testing of the electronic device.

In one illustrative embodiment, the template is sufficiently thick that the probes extend into it prior to testing. The balls of the electronic device are then inserted into the aperture, and, as the device is forced toward the conductive probes, the template moves against a spring bias so that the balls can all make contact with the probes. The probes themselves are spring-loaded and each have a needle projection for piercing a solder ball and insuring good electrical contact. The technique can be repeated quickly and easily, with reliable connections in all cases.

These and other objects, features and benefits of the invention will be better understood from a consideration of the following detailed description taken in conjunction with the accompanying drawing.

DETAILED DESCRIPTION

Figure 1:
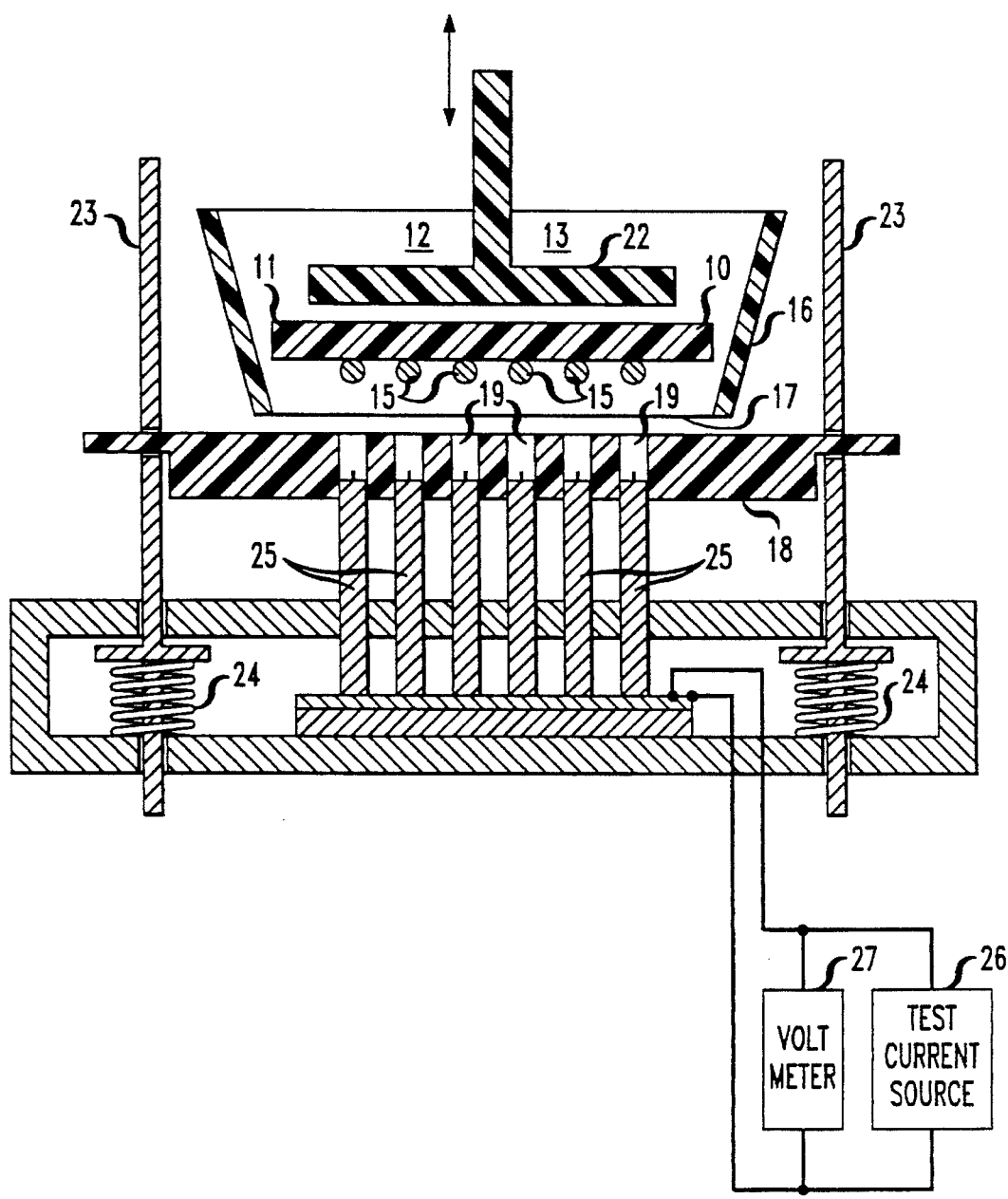
FIG. 1 is a schematic sectional, partially exploded, view of an electronic device testing apparatus in accordance with an illustrative embodiment of the invention.

FIG. 1 shows a schematic partially exploded view of apparatus for testing an electronic device 10. The illustration is schematic and is not necessarily to scale. The device 10 to be tested is illustratively a multi-chip module of the type known as a bump grid array or ball grid array (BGA). It basically comprises an insulative substrate 11 having on an upper surface encapsulated devices such as integrated circuit chips and capacitors, not shown, and, on the opposite surface, a matrix array of solder ball terminations 15. By making the terminations in the configuration of a matrix array, one can accommodate, a high density of conductive interconnections on the substrate 11, as is known in the art.

Figure 2:
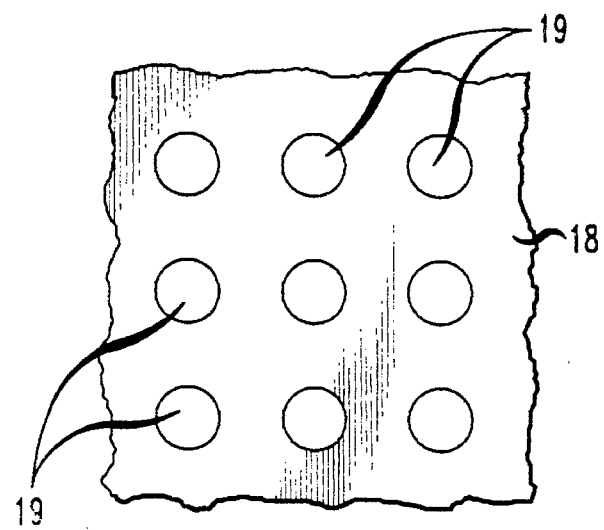
FIG. 2 is a fragmentary view of part of the template of the apparatus of FIG. 1.

The device is tested by first placing it in a funnel 16 having a lower opening 17-of approximately the same configuration as the outer periphery of electronic device 10. The opening 17 rests on, or is in close proximity to, an insulative template 18 containing a matrix array of apertures 19. The configuration of the array of apertures 19 matches the matrix array of the solder balls 15 so that each of the solder balls fits into one of the apertures 19. A fragmentary top view of some of the apertures 19 is shown in FIG. 2 to illustrate their matrix configuration.

When the electronic device is seated on the template 18 with each of the solder balls extending into an aperture 19, a member 22 is caused to bear against the top surface of electronic device 10. Template 18 is biased by springs 24 that are compressed by the downward force. The solder balls 15 are forced into contact with conductive probes 25 that extend into the apertures 19. After all of the balls 15 make contact with the conductive probes 25, the electronic: device is tested by directing through it a current from a source 26 and detecting various voltages by a volt meter 27. The current passes through conductive probes 25, the solder balls 15, circuitry on the board 11, and returns via other conductive probes 25.

Figure 3:
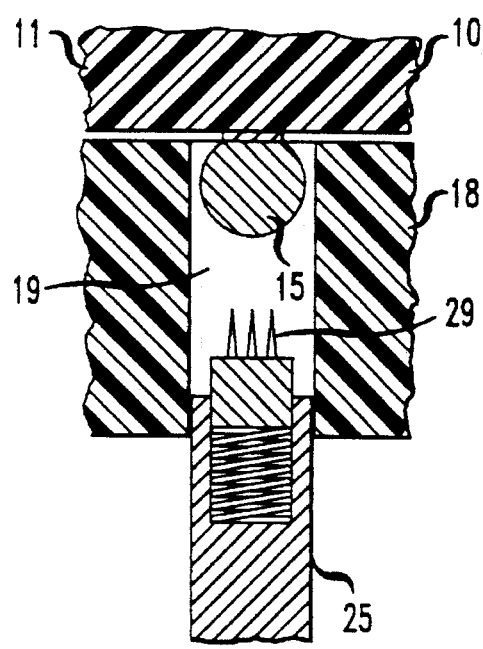
FIG. 3 is an enlarged view of one of the conductive probes of the apparatus of FIG. 1.
Figure 4:
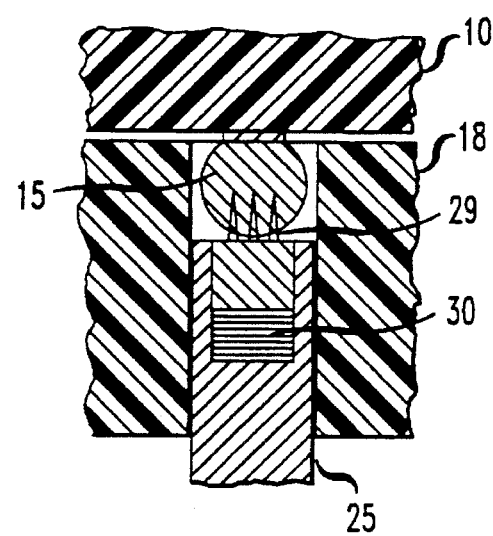
FIG. 4 shows the conductive probe of FIG. 3 in contact with a solder ball.

Referring to FIG. 3, when the device 10 originally contacts the template 18, each of the balls 15 extends into the aperture 19, but is separated from the conductive probe 25. The conductive probe 25 is spring-loaded and contains on its upper surface three needle-like projections 29. When the template 18 is forced downwardly as described before, the probe 25 makes contact with the ball 15, and the projections 29 pierce the solder ball 15 as shown in FIG. 4. The spring 30 contained in the probe 25 also becomes compressed to further insure an appropriate bias force of the probe against the solder ball 15, as is required for a dependable electrical contact. The projections 29 pierce any residual flux on the solder balls and compensate for any differences in solder ball diameter or other asymmetries.

After the test has been completed, member 22 is vertically raised, projections 29 are withdrawn from the solder balls, and electronic device 10 is removed from the apparatus. A succeeding electronic device is then tested by the same process. It can be appreciated that successive electronic devices are easily inserted into the apparatus; manual inspection can show that all of the solder balls 15 have been seated in apertures 19, because, if there is not such seating, the device 10 is tilted and is not mechanically stable. Thus, by assuring appropriate seating of the array of solder balls 15 in the array of apertures 19, one assures appropriate alignment for making a successful test.

The apparatus has been made and used, and has been found to be extremely reliable. In apparatus that has been used, the electronic device 10 was 1.1 inch square and had a thickness of .025 inch. Six integrated circuit chips were mounted to a silicon substrate which in turn was bonded to the upper surface of the insulative substrate 11, which was made of bismaleimide triazine. The solder bumps ranged from 36.5 mil to 43.1 mil in diameter and were arranged in a 10×10 matrix (one hundred solder bumps) with a pitch of one hundred mils. The apertures 19 were cone-shaped to accommodate the particular probes 25 that were used, and had an upper diameter of 0.045 inch, a lower diameter of 0.08 inch and a length of 0.085 inch. The opening 17 in funnel 16 was 1.15 inch square. The funnel 16 was integral with template 18 and contained openings to permit device 10 to be grasped for unloading it. The length of each conductive probe 25 was 1.95 inch. The downward force on member 22 was applied manually.

It is to be understood that the illustrative embodiment that has been described in detail is intended to be only illustrative of the inventive concepts involved. In particular, the method is amenable to automatic operation, using robotic device placement. The array of probes 25 could be moved vertically upwardly to contact the solder balls, rather than moving the device 10 and template 18 downwardly as has been described. The substrate 11 may constitute what is known in the art as a printed wiring board. Other embodiments and modifications thereof can be made by those skilled in the art without departing from the spirit and scope of the invention.

I claim:

1. A method for testing an electronic device having on one side thereof an array of solder bumps arranged in a first configuration comprising the steps of:

forming an array of spring-loaded conductive probes arranged in said first configuration;

forming an insulative template comprising an array of apertures arranged in said first configuration;

aligning the apertures of the template with the spring-loaded conductive probes;

inserting the electronic device in a funnel having a lower opening and an upper opening larger than the lower opening, the lower opening located in proximity to the template and having the approximate configuration of the outer periphery of the electronic device;

forcing the electronic device against the template such that each solder bump projects into an aperture thereof to contact a spring-loaded conductive probe;

and passing electrical current through at least part of the electronic device, at least some of the solder bumps, and at least some of the conductive probes to test electrically the electronic device.

2. The method of claim 1 wherein:

prior to the forcing step, the spring-loaded conductive probes are projected into the apertures of the template.

3. The method of claim 1 wherein:

the template is mounted on a spring-loaded support;

and the forcing step moves the template with respect to the conductive probes.

4. The method of claim 1 wherein:

the solder bumps are substantially spherical segments;

and the conductive probes each comprise at least one needle-like conductive projection adapted to pierce a solder ball.

5. The method of claim 4 wherein:

the electronic device is a printed wiring board containing at least one integrated circuit on an upper surface thereof, and the solder balls on a lower surface thereof.

6. A method for testing an electronic device having on one side thereof a matrix array of solder balls that function as electrical terminations for the electronic device, the method comprising the steps of:

arranging a plurality of spring-loaded conductive probes in a matrix array that matches the matrix array of said solder balls;

making in an insulative template a plurality of template apertures arranged in a matrix array that matches the matrix array of said solder balls;

providing a guiding structure for the template;

inserting one end of each of said conductive probes in a first end of one of the template apertures;

providing a funnel over the template, the funnel having a lower opening and an upper opening larger than the lower opening, the lower opening having a configuration that approximates the configuration of the outer periphery of the electronic device;

inserting the electronic device in the funnel with the solder balls down such that each of the solder balls can be directed into a template aperture;

inserting one of said solder balls in a second end of each of said template apertures opposite the first end of such aperture;

moving the electronic device and the template with respect to the conductive probes, and along the guiding structure, such that each of the solder balls makes electrical contact with one of the conductive probes;

and directing electrical current through the electronic device via the conductive probe and the solder balls to test the electronic device.

7. The method of claim 6 wherein:

the template is arranged vertically above the conductive probes, the electronic device is arranged vertically above the template, and the moving step comprises the step of exerting a downward force on the electronic device and the template.

8. The method of claim 7 wherein:

the guiding structure is spring-loaded;

and the moving step moves the template against the spring-loading of the guiding structure.

9. The method of claim 8 wherein:

the solder balls are substantially spherical segments;

and the conductive probes comprise needle-like projections adapted to pierce a solder ball.

* * * * *